US011035723B2

(12) United States Patent
Huang

(10) Patent No.: US 11,035,723 B2
(45) Date of Patent: Jun. 15, 2021

(54) OPTICAL SENSOR PACKAGE ASSEMBLY, MANUFACTURING METHOD THEREOF AND ELECTRONIC DEVICES

(71) Applicant: Silergy Semiconductor Technology (Hangzhou) LTD, Hangzhou (CN)

(72) Inventor: Kai Chun Huang, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 765 days.

(21) Appl. No.: 15/834,332

(22) Filed: Dec. 7, 2017

(65) Prior Publication Data

US 2018/0188105 A1    Jul. 5, 2018

(30) Foreign Application Priority Data

Dec. 29, 2016  (CN) .......................... 201611246730.5

(51) Int. Cl.
*G01J 1/42* (2006.01)
*G01J 1/02* (2006.01)
*G01J 1/08* (2006.01)
*H01L 25/16* (2006.01)
*H01L 31/02* (2006.01)
*H01L 31/16* (2006.01)

(52) U.S. Cl.
CPC .......... *G01J 1/4204* (2013.01); *G01J 1/0204* (2013.01); *G01J 1/0214* (2013.01); *G01J 1/0271* (2013.01); *G01J 1/08* (2013.01); *H01L 25/165* (2013.01); *H01L 25/167* (2013.01); *H01L 31/02002* (2013.01); *H01L 31/16* (2013.01); *H01L 2224/05554* (2013.01); *H01L 2224/48091* (2013.01); *H01L 2224/48145* (2013.01); *H01L 2224/48227* (2013.01)

(58) Field of Classification Search
CPC .......... G01J 1/4204; G01J 1/42; G01J 1/0204; G01J 1/0214; G01J 1/0271; G01J 1/08; H01L 25/165; H01L 25/167; H01L 25/16; H01L 31/02002; H01L 31/16; H01L 2224/05554; H01L 2224/05553; H01L 2224/05552; H01L 2224/05551; H01L 2224/48091; H01L 2224/48145; H01L 2224/48227

See application file for complete search history.

(56) References Cited

U.S. PATENT DOCUMENTS

| 8,305,482 | B2 * | 11/2012 | Yen ........................ G02B 7/005 |
| | | | 348/345 |
| 9,006,636 | B2 | 4/2015 | Findlay |
| 9,735,135 | B2 | 8/2017 | Lee et al. |
| 2007/0114641 | A1 | 5/2007 | Goh et al. |
| 2008/0006762 | A1 * | 1/2008 | Fadell ........................ G01J 1/44 |
| | | | 250/201.1 |
| 2010/0258712 | A1 * | 10/2010 | Wiese ................... H01L 25/167 |
| | | | 250/237 R |

(Continued)

*Primary Examiner* — John R Lee
(74) *Attorney, Agent, or Firm* — Michael C. Stephens, Jr.

(57) ABSTRACT

An optical package assembly can include: a first circuit board; a second circuit board and a first structure arranged on the first circuit board, where the second circuit board is adjacent to the first structure; and a second structure arranged on the second circuit board, where a thickness of the first structure is equal to a combined thickness of the second circuit board and the second structure.

20 Claims, 17 Drawing Sheets

(56) References Cited

U.S. PATENT DOCUMENTS

| | | | |
|---|---|---|---|
| 2011/0057129 A1* | 3/2011 | Yao | G01S 17/48 250/552 |
| 2011/0186736 A1* | 8/2011 | Yao | G01S 7/4813 250/338.4 |
| 2012/0146948 A1* | 6/2012 | Tong | G06F 3/042 345/175 |
| 2013/0001755 A1* | 1/2013 | Kagaya | H01L 25/0657 257/666 |
| 2013/0267273 A1* | 10/2013 | Rudmann | B29D 11/00375 455/556.1 |
| 2013/0292706 A1* | 11/2013 | Costello | G01D 5/34715 257/82 |
| 2013/0327931 A1* | 12/2013 | Hsu | G01S 7/4813 250/237 R |
| 2014/0042305 A1* | 2/2014 | Liu | G01V 8/12 250/216 |
| 2014/0061444 A1* | 3/2014 | Wang | G01S 7/4813 250/214.1 |
| 2014/0103199 A1* | 4/2014 | Loong | G01S 7/493 250/214.1 |
| 2014/0231635 A1* | 8/2014 | Kerness | H01L 31/02325 250/226 |
| 2014/0252209 A1* | 9/2014 | Land | G01J 1/4204 250/208.2 |
| 2014/0340302 A1* | 11/2014 | Sengupta | G06F 3/042 345/156 |
| 2015/0216053 A1* | 7/2015 | Sauer | H01L 25/0652 361/783 |
| 2016/0025855 A1* | 1/2016 | Camarri | G01S 17/08 250/206.1 |
| 2016/0043064 A1* | 2/2016 | Tran | H01L 27/14 257/82 |
| 2016/0141322 A1* | 5/2016 | Gokingco | G01J 1/0433 250/226 |
| 2016/0141440 A1* | 5/2016 | Chun | H01L 31/18 257/82 |
| 2016/0146639 A1* | 5/2016 | Chan | G01S 17/04 250/393 |
| 2016/0187530 A1* | 6/2016 | Ma | H01L 31/167 257/82 |
| 2016/0190380 A1* | 6/2016 | Luan | G01S 17/04 257/82 |
| 2016/0238441 A1* | 8/2016 | Chu | G01J 1/0411 |
| 2016/0259056 A1* | 9/2016 | Heng | G01S 7/4813 |
| 2016/0282510 A1* | 9/2016 | Kwangkaew | G01S 17/04 |
| 2016/0284920 A1* | 9/2016 | Saugier | G01S 17/08 |
| 2016/0307881 A1* | 10/2016 | Ho | H01L 31/12 |
| 2016/0356437 A1* | 12/2016 | Kim | F21V 5/10 |
| 2017/0052040 A1* | 2/2017 | Luan | H05K 3/32 |
| 2017/0284864 A1* | 10/2017 | Chen | G01J 1/04 |
| 2017/0287886 A1* | 10/2017 | Gani | G06F 3/0416 |
| 2017/0345961 A1* | 11/2017 | Shentu | H01L 31/02162 |
| 2018/0023984 A1* | 1/2018 | Yang | G01D 11/245 73/431 |
| 2018/0164409 A1* | 6/2018 | Chen | G01S 7/4813 |
| 2018/0188105 A1* | 7/2018 | Huang | H01L 25/165 |
| 2019/0154870 A1* | 5/2019 | Lin | G01V 8/12 |
| 2019/0363216 A1* | 11/2019 | Lin | G01S 17/08 |

* cited by examiner

OPTICAL SENSOR PACKAGE ASSEMBLY, MANUFACTURING METHOD THEREOF AND ELECTRONIC DEVICES

RELATED APPLICATIONS

This application claims the benefit of Chinese Patent Application No. 201611246730.5, filed on Dec. 29, 2016, which is incorporated herein by reference in its entirety.

FIELD OF THE INVENTION

The present invention generally relates to optical sensors, and more particularly, to optical sensor package assemblies, manufacturing methods thereof, and associated electronic devices.

BACKGROUND

In some portable electronic devices, such as smart phones that usually employ an ambient light sensor (ALS) to sense ambient light brightness, the screen brightness can vary with the ambient light in order to increase the service life. In addition, a proximity sensor (PS) and light-emitting component (e.g., an infrared LED) may be utilized to sense the proximity of an object. When an object (e.g., a user's face) gets close to the screen, the touch function of the screen can be automatically shut down in order to avoid false triggering when the user is answering the phone to enhance device interaction.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

An ambient light sensor (ALS), proximity sensor (PS), and light-emitting component can be integrated into a package assembly in order to form an optical sensor package assembly. This may share space, consumable material, and also allow for the combination of circuitry layout. For example, such optical sensor package assemblies may be installed on the side of a display panel of a mobile phone. To accommodate different types of the optical sensor package assemblies, an opening (e.g., rectangular, circular, etc.) may be designed on the surface of a mobile phone. In order to improve the appearance of the phone or mobile device, the aperture of the opening should be as small as possible. However, the proximity sensing angle between the light-emitting component and the PS may not be too large or too small, while a larger ambient light sensing angle of the ALS provides for better sensing performance of the ALS. When the ALS and PS are integrated together into one package structure, both the ALS and the PS need to conform with the opening, and this arrangement is thus important for miniaturization of the phone surface openings.

Figure 1A:
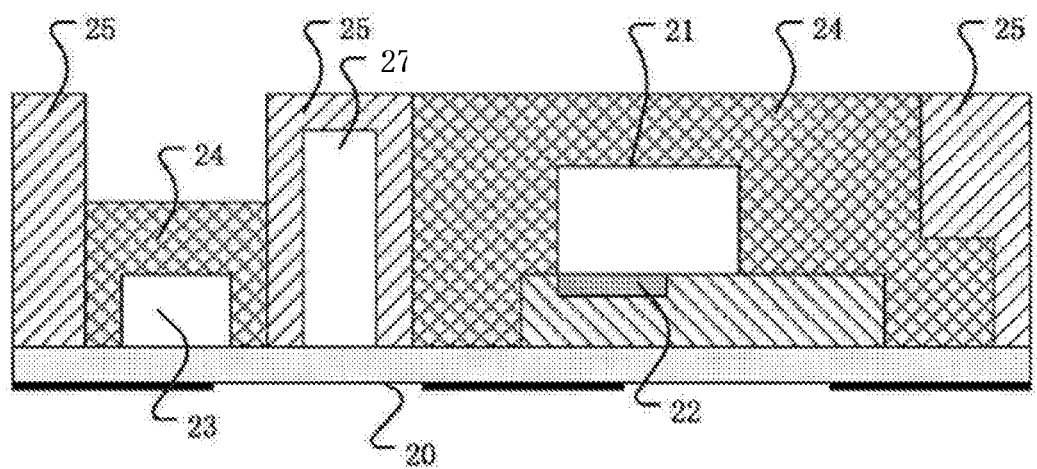
FIG. 1A is a cross-sectional view of an example optical sensor package assembly.
Figure 1B:
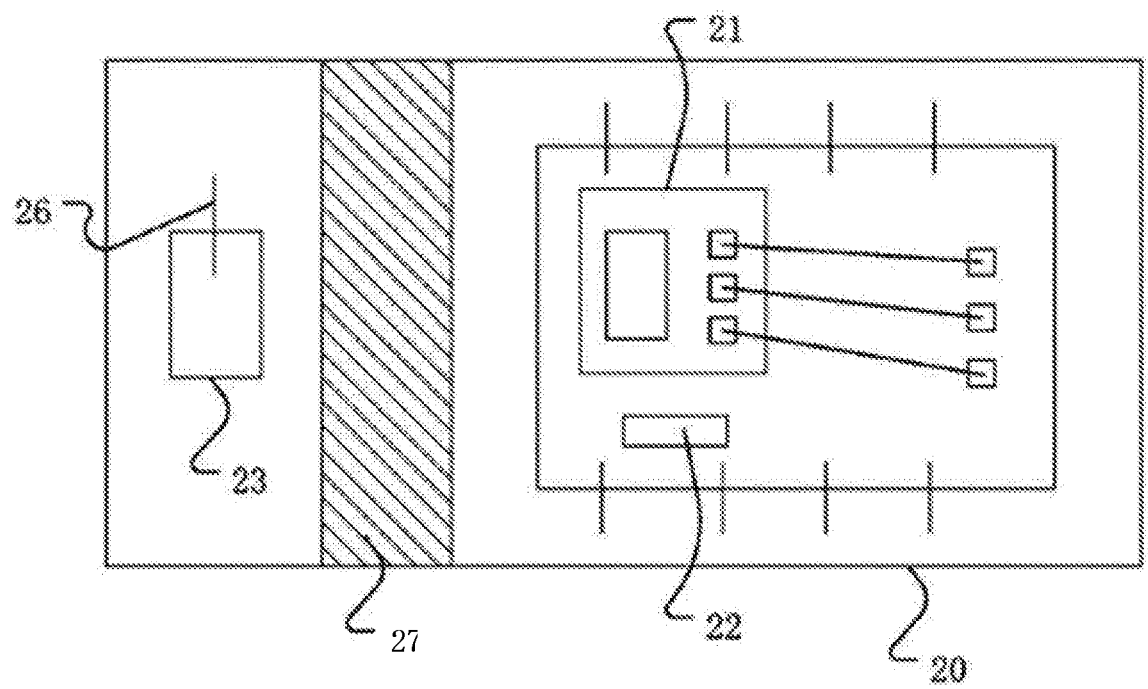
FIG. 1B is a top view of an example optical sensor package assembly.

Referring now to FIGS. 1A and 1B, shown are views of an example optical sensor package assembly. In this example, ambient light sensor 21 and proximity sensor 22 are separated from each other such that the distance between ambient light sensor 21 and light-emitting component 23, and the distance between proximity sensor 22 and light-emitting component 23 is shortened to obtain a smaller proximity sensing angle, larger ambient light sensing angle, and smaller opening aperture on the phone panel surface. However, due to different requirements of different customers, when the distance between the opto-mechanical design touch panel (TP) of the system customer and the device increases, the thickness of light-emitting component 23 should accordingly be increased in order to meet requirements of opto-mechanical applications.

If the thickness of light-emitting component 23 is too high, there may be a greater risk to reliability when completing the wire-bonding process to electrically connect the electrode of light-emitting component 23 surface to substrate 20 using electrical wire 26. Because of the increased thickness of light-emitting component 23, and the relatively close distance between baffle 27 and light-emitting component 23, the welding process may be difficult to implement in this case. Furthermore, two packaging processes may be needed in forming the optical sensor package assembly. For example, a number of transparent encapsulant layers 24 may be initially formed, followed by non-transparent encapsulant layers 25 being formed. Such a relatively complex packaging process can make it difficult to reduce the overall size of the package assembly.

In one embodiment, an optical package assembly can include: (i) a first circuit board; (ii) a second circuit board and a first structure arranged on the first circuit board, where the second circuit board is adjacent to the first structure; and (iii) a second structure arranged on the second circuit board, where a thickness of the first structure is equal to a combined thickness of the second circuit board and the second structure.

Referring now to FIGS. 2-5, shown are views based on different angles of a first example optical sensor package assembly, in accordance with embodiments of the present invention. In this particular example, the optical sensor package assembly can include circuit board 101 and circuit board 102. Circuit board 102 can be arranged on a first surface of circuit board 101. The two longer sides of circuit board 102 are coincident with first and second sides of circuit board 102. Also, the first side of circuit board 102 and a first side of circuit board 101 are aligned. For example, circuit board 102 can be a light-emitting diode (LED) package carrier board.

Figure 2:
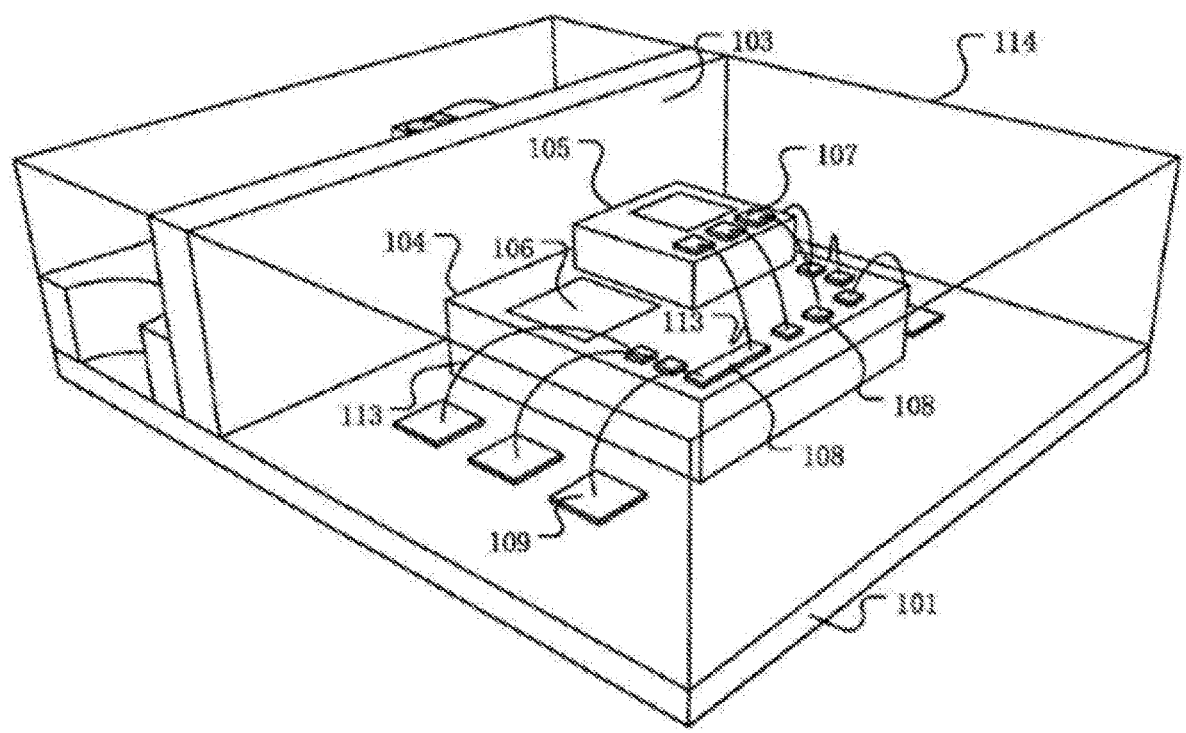
FIGS. 2, 3, and 4 are perspective views based on different angles of a first example optical sensor package assembly, in accordance with embodiments of the present invention.
Figure 5:
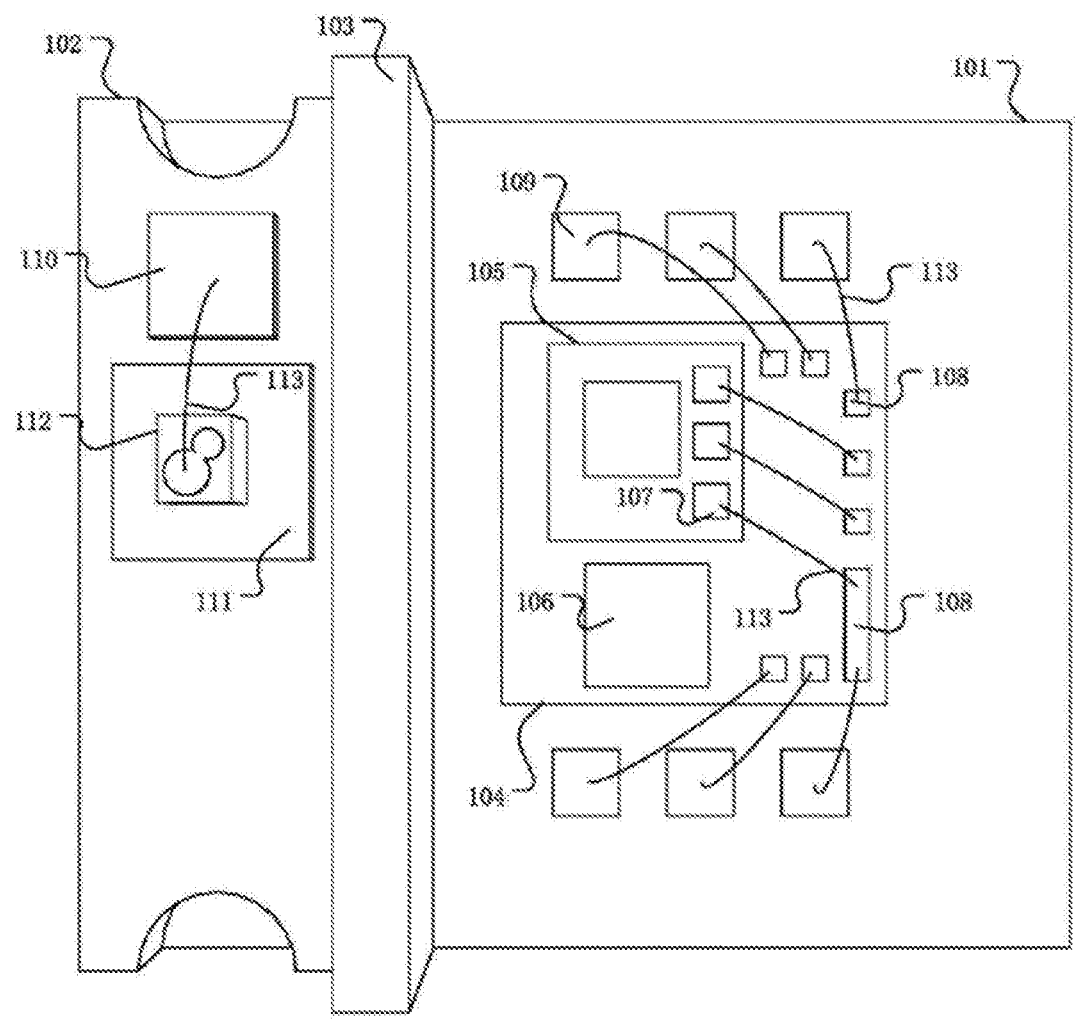
FIG. 5 is a top view of the first example optical sensor package assembly, in accordance with embodiments of the present invention.

For example, a third side and a fourth side of circuit board 102 (except for the first and second sides) each have a groove (e.g., a U-type groove) that longitudinally penetrate circuit board 102. Due to the presence of the groove, circuit board 102 can be fixed tightly on the upper surface of circuit board 101 by a transparent encapsulant in order to prevent circuit board 102 from becoming dislodged under relatively high heat. In FIGS. 2 and 5, integrated circuit die 104 and circuit board 102 can be arranged side-by-side on a first surface of circuit board 101, which can be provided with pads 109. Pads 109 may be arranged in two rows and disposed on two opposite sides of integrated circuit die 104.

Proximity sensor 106 can be embedded on the upper surface of integrated circuit die 104, and ambient light sensor 105 may be disposed on the upper surface of integrated circuit die 104. Ambient light sensor 105 may bulge with a predetermined thickness relative to the upper surface of integrated circuit die 104, and ambient light sensor 105 may not shield proximity sensor 106. Except for the area of the upper surface of integrated circuit die 104 embedded by proximity sensor 106 and installed by ambient light sensor 105, the remaining area of the upper surface of integrated circuit die 104 may be provided with pads 108, and the upper surface of ambient light sensor 105 can be provided with pads 107. Pads 107 and 109 may be electrically connected to corresponding pads 108 through respective wires 113.

Figure 3:
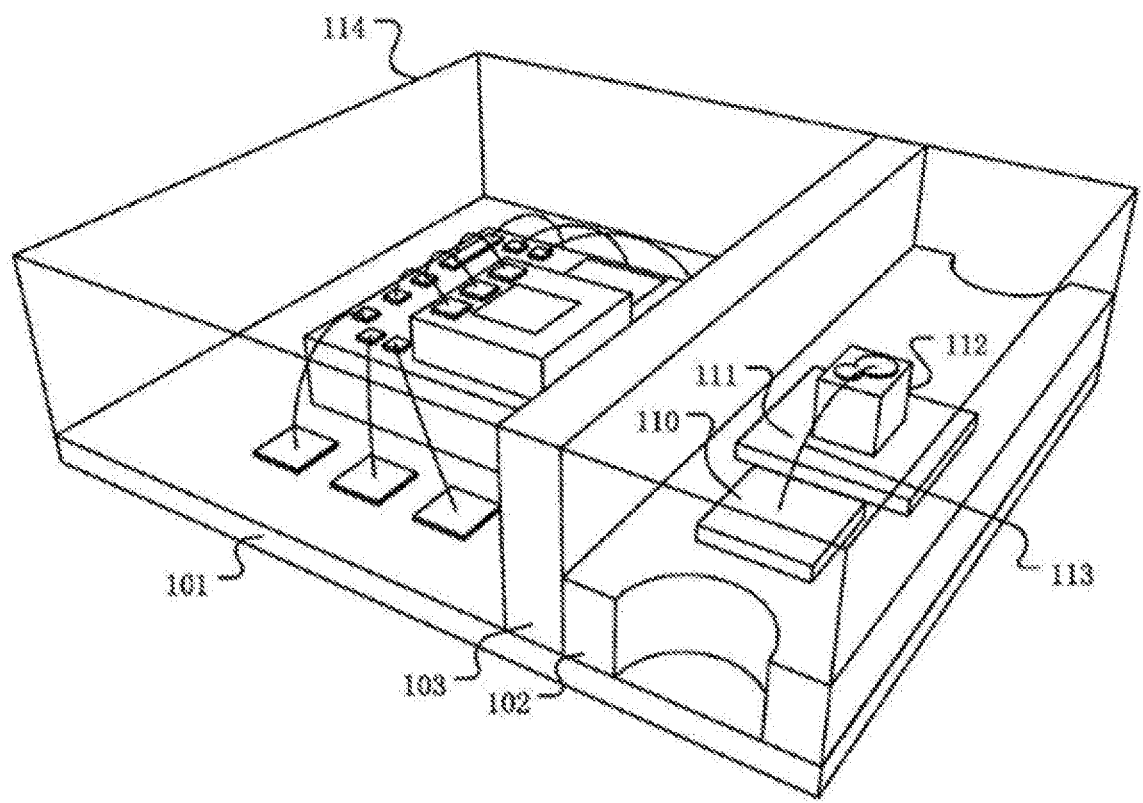

In FIGS. 3 and 5, pads 110 and 111 may be provided on the upper surface of circuit board 102, and light-emitting component 112 can be installed on the upper surface of pads 111. Light-emitting component 112 can be any one of a light vertical cavity surface emitting laser (VCSEL), a light-emitting diode (VCSEL LED), and a laser diode (e.g., ASIC Die). Light-emitting component 112 can be electrically connected to pads 110 through wires 113.

Figure 4:
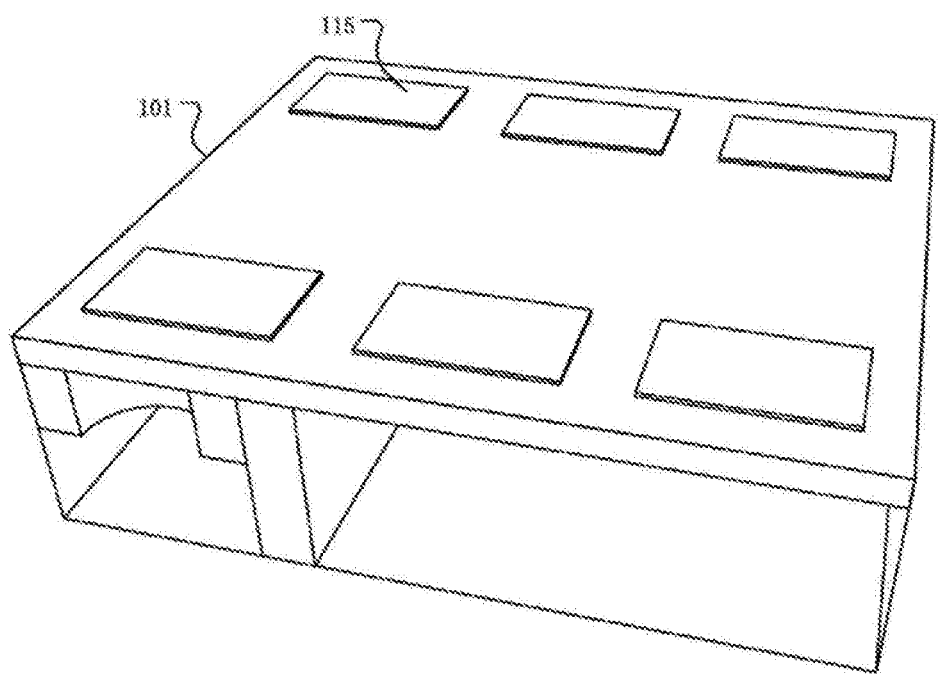

Referring to FIG. 4, pads 115 may be provided on a second surface of circuit board 101. Pads 115 effectively penetrate circuit boards 101 and 102, and are electrically coupled to integrated circuit die 104. Also, by effectively penetrating circuit boards 101 and 102, pads 115 can electrically connect to light-emitting component 112, which can also form a surface adhesion component for the optical sensor package assembly. For example, pads 107, 108, 109, 110, 111, and 115 can be aluminum pads, and wires 113 can be gold wires.

In FIGS. 2-5, baffle 103 (e.g., plastic, ceramic, metal, etc.) can be positioned between light-emitting component 112 and integrated circuit chip 104. Baffle 103 can be installed on the first surface of circuit board 101, and may be closely adjacent to the second side of circuit board 102. Baffle 103 can effectively block the transmission of undesirable light (e.g., infrared light) by directing, scattering, and/or refracting light between light-emitting component 112 (e.g., an infrared LED lamp) and ambient light sensor 105. This can reduce the crosstalk and interference between light-emitting component 112 and ambient light sensor 105. This example optical sensor package assembly can also include transparent encapsulant layer 114 to encapsulate light-emitting component 112, integrated circuit chip 104 (e.g., in which the proximity sensor 106 is embedded), ambient light sensor 105, and baffle 103.

In particular embodiments, the optical sensor package assembly can effectively raise the thickness of light-emitting component 112 because circuit board 102 is included. Regardless of the distance between the touch panel of the system customer and the device, the thickness of proximity sensor 106, ambient light sensor 105, and light-emitting component 112 may not need to be adjusted in order to meet various customer opto-mechanical application requirements. The thickness of proximity sensor 106, ambient light sensor 105, and light emitting element 112 may not need to be very thick to improve the reliability of the wire-bonding process. Because the thickness of light-emitting component 112 can be relatively small and may be closely adjacent to baffle 103, the size of the package can be reduced as much as possible, and the aperture of the openings in the phone or mobile device panel can be also as small as possible without sacrificing the sensing range of proximity sensor 106.

Furthermore, because circuit board 102 is included, the thickness of light-emitting component 112 can effectively be raised, and emission path range 117 (see, e.g., FIG. 9B) of the self-emitting light source from light-emitting component 112 may be relatively narrow. Thus, when ambient light sensing range 118 (see, e.g., FIG. 9B) of ambient light sensor 105 is increased, the interference of the reflected light by the self-emitting light source from light-emitting component 112 to ambient light sensor 105 can be reduced, and the proximity sensing angle between light-emitting component 112 and proximity sensor 106 may be further optimized. In addition, only one package molding process may be needed in order to form this example optical sensor package assembly, which can simplify the manufacturing process and reduce the overall size of the optical sensor package assembly.

Figure 6:
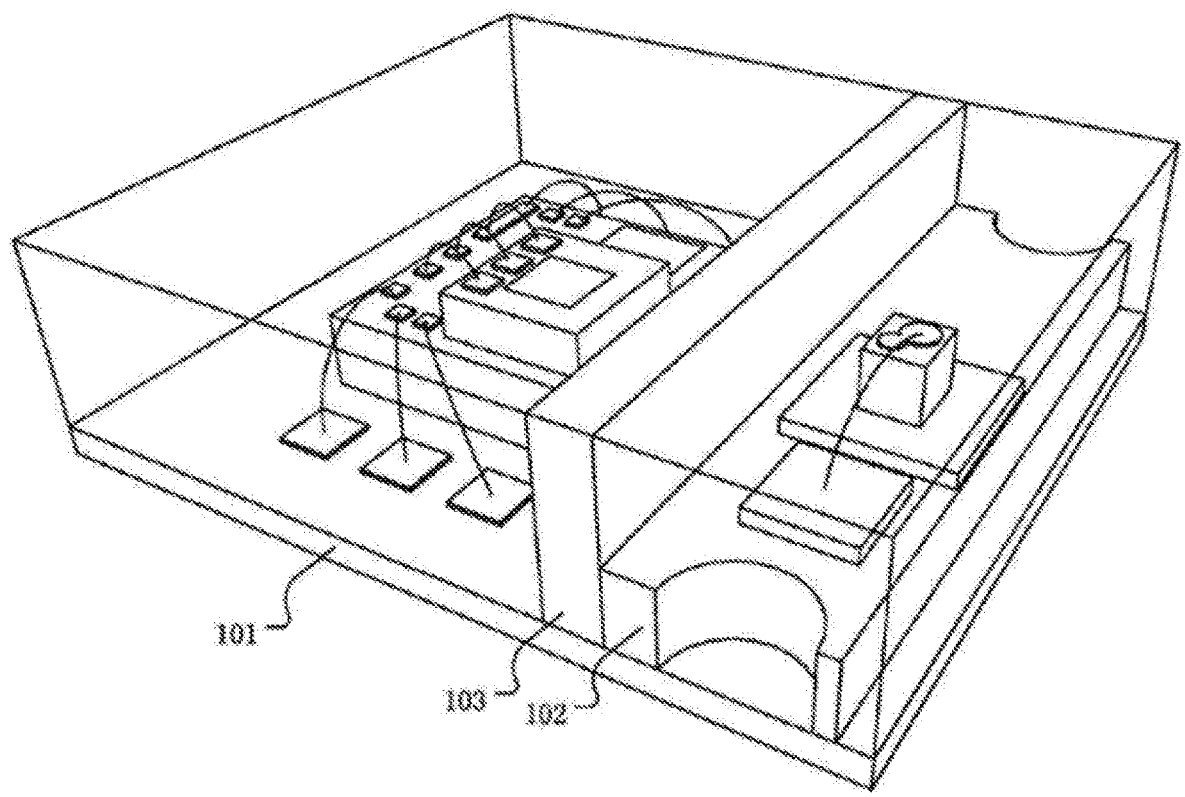
FIG. 6 is a perspective view of a second example optical sensor package assembly, in accordance with embodiments of the present invention.

Referring now to FIG. 6, shown is a perspective view of a second example optical sensor package assembly, in accordance with embodiments of the present invention. In this particular example, the first side of circuit board 102 may be retracted by a predetermined distance relative to the first side of circuit board 101. In this case, the first side of circuit board 102 can be retracted by a predetermined distance relative to the first side (e.g., right edge) of circuit board 101, in order to improve the combination performance between the transparent encapsulant layer and circuit board 102. This can prevent circuit board 102 from possibly dislodging when under relatively high heat conditions.

Figure 7:
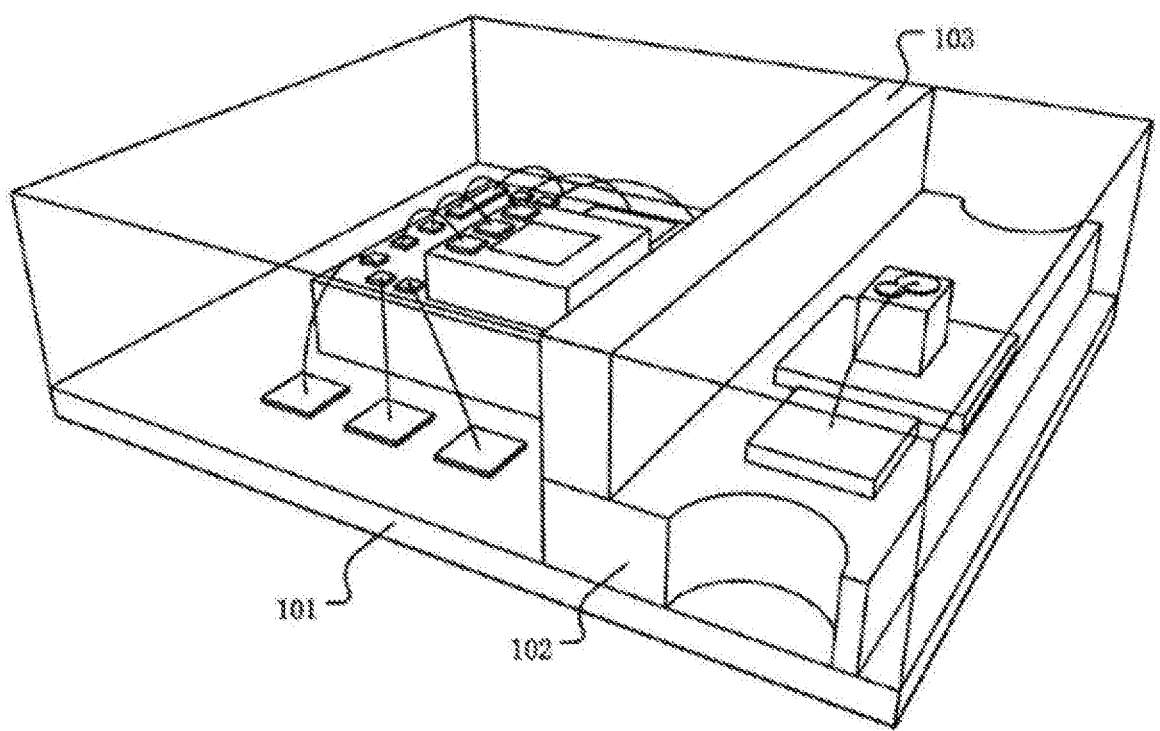
FIG. 7 is a perspective view of a third example optical sensor package assembly, in accordance with embodiments of the present invention.

Referring now to FIG. 7, shown is a perspective view of a third example optical sensor package assembly, in accordance with embodiments of the present invention. In this particular example, baffle 103 can be arranged on the upper surface of circuit board 102, and may be adjacent to the second side of circuit board 102. In this case, baffle 103 can be arranged on the upper surface of circuit board 102 in order to fix circuit board 102 to improve the combination performance between transparent encapsulant layer and circuit board 102. This can prevent circuit board 102 from possibly dislodging when under relatively high heat conditions.

In one embodiment, a method of manufacturing an optical sensor package assembly, can include: (i) arranging a second circuit board and a first structure on a first circuit board, where the second circuit board is adjacent to the first structure; and (ii) arranging a second structure on the second circuit board, where a thickness of the first structure is equal to a combined thickness of the second circuit board and the second structure.

Figure 8A:
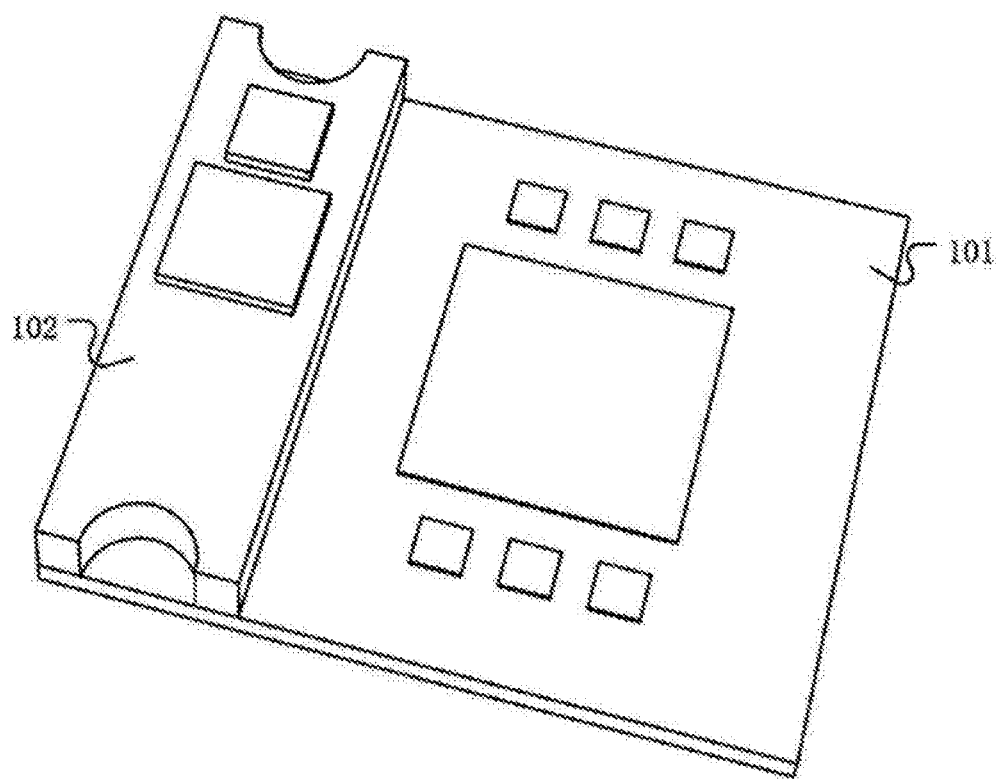
FIGS. 8A-8G are perspective views of different steps of an example method of making an optical sensor package assembly, in accordance with embodiments of the present invention.
Figure 8B:
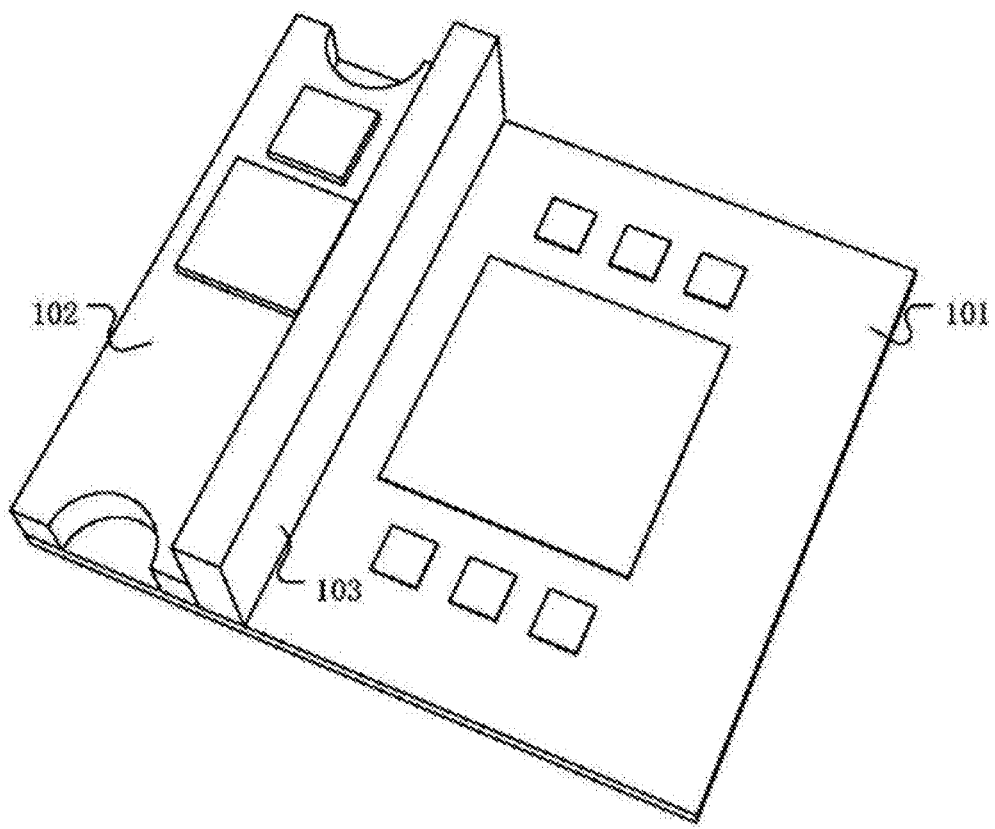
Figure 8C:
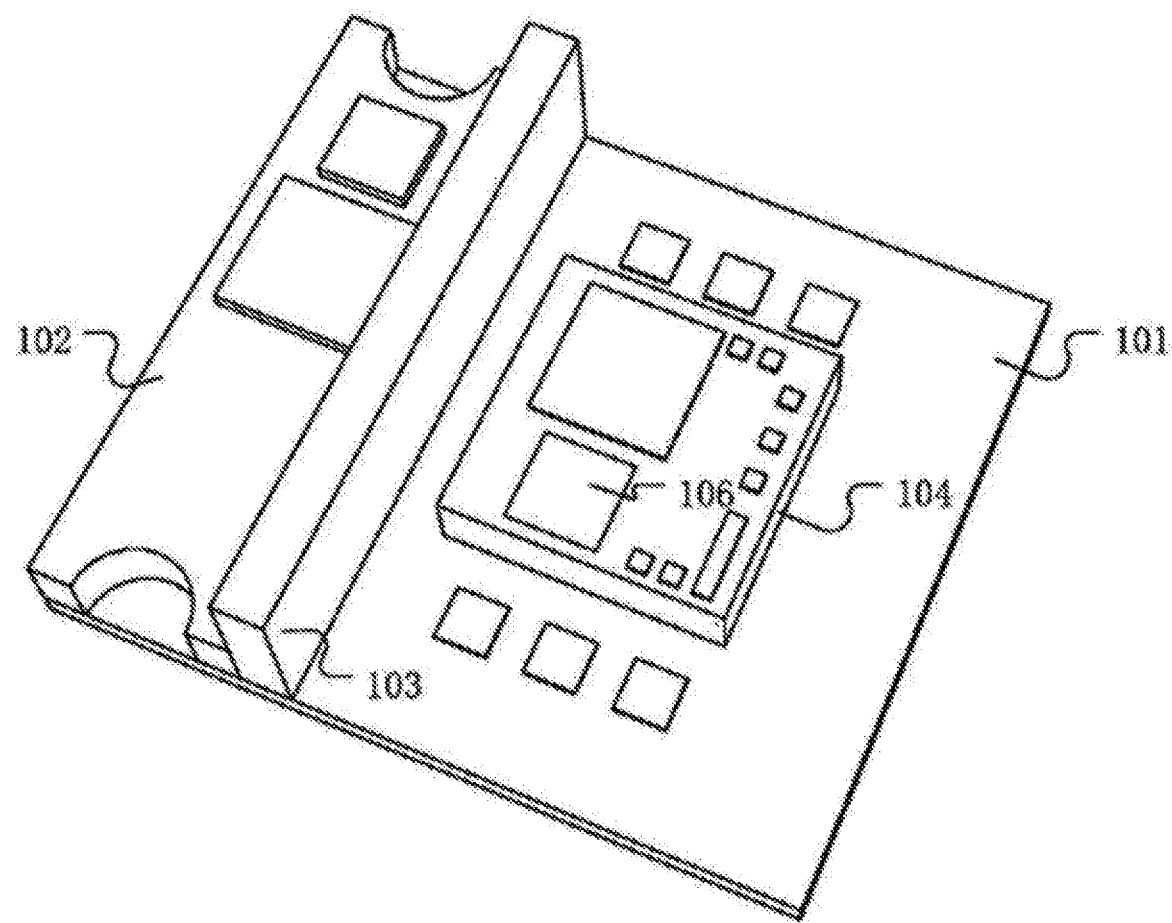

Referring now to FIGS. 8A-8G, shown are perspective views of different steps of an example method of making an optical sensor package assembly, in accordance with embodiments of the present invention. In this particular example, a molded optical device can be implemented. In FIG. 8A, circuit board 102 can be installed on the first surface of circuit board 101, and the first side of circuit board 102 may be aligned with the first side of circuit board 101. In FIG. 8B, baffle 103 can be installed on the first surface of circuit board 101 and adjacent to the second side of circuit board 102. In FIG. 8C, integrated circuit die 104 may be installed on the region of the first surface of circuit board 101 that is not covered by circuit board 102 and baffle 103, and proximity sensor 106 can be embedded on the upper surface of integrated circuit die 104.

Figure 8D:
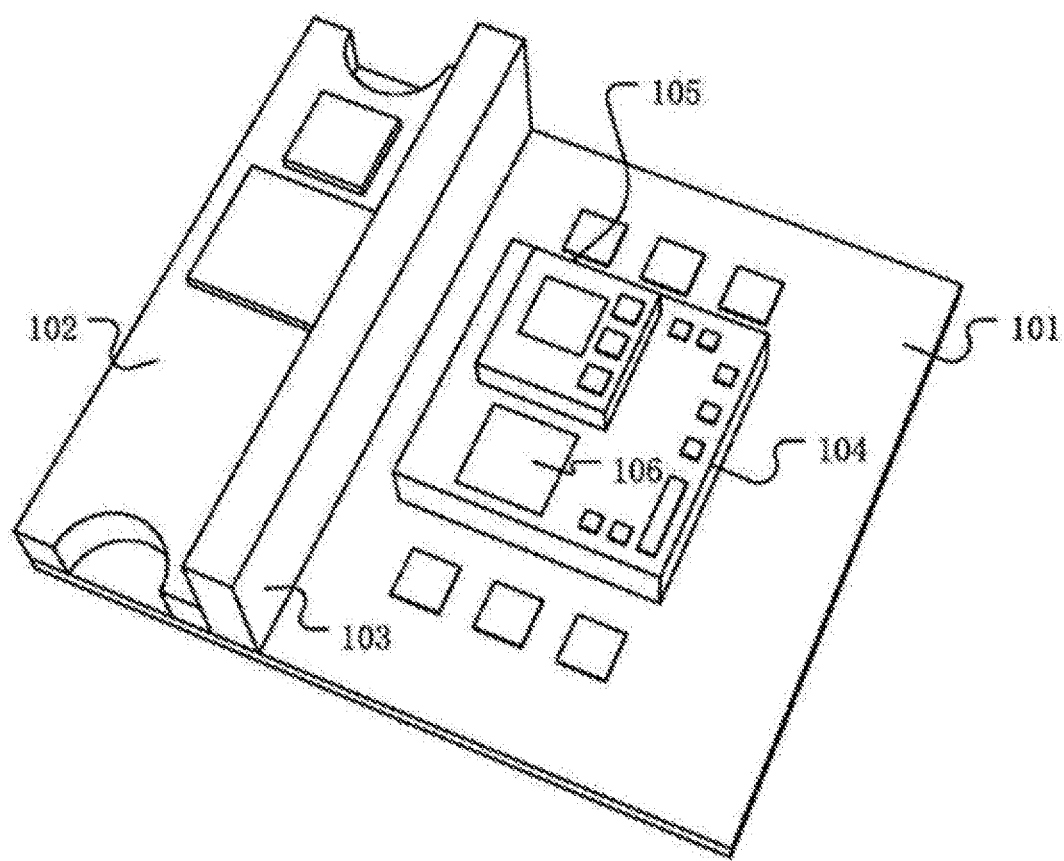
Figure 8E:
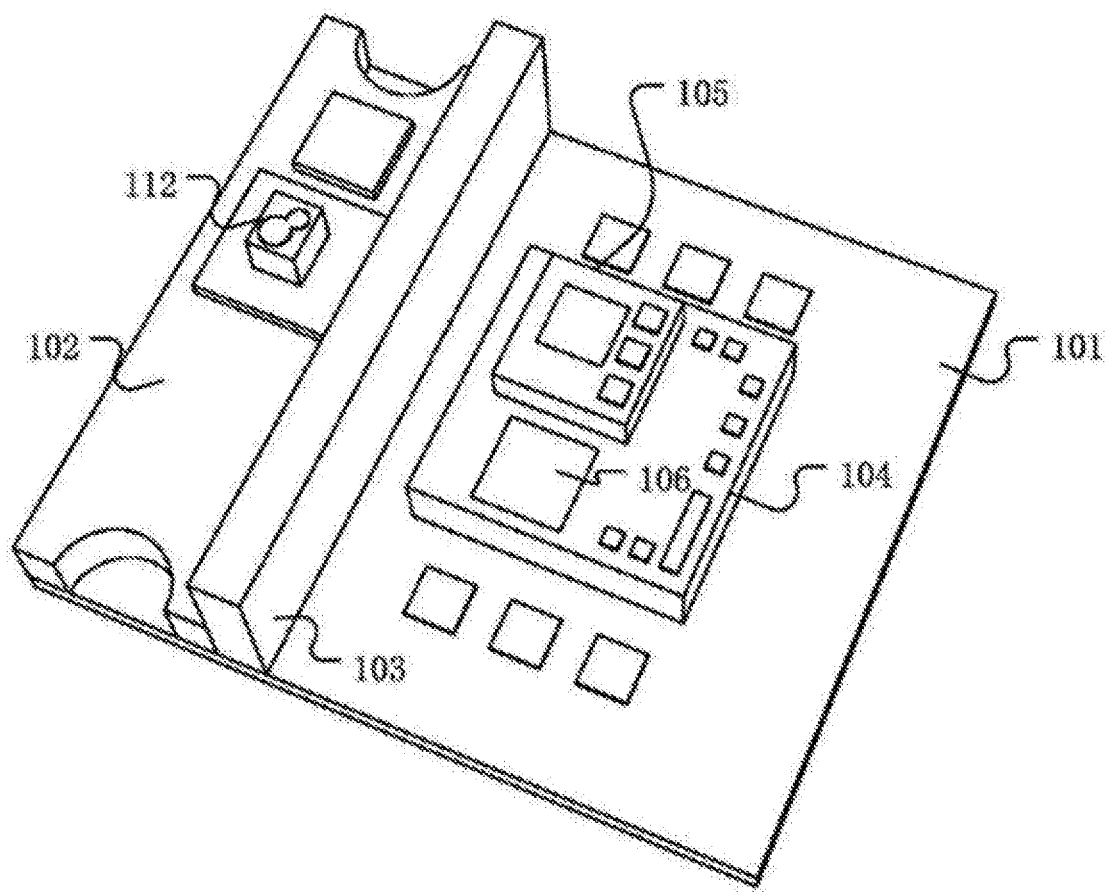
Figure 8F:
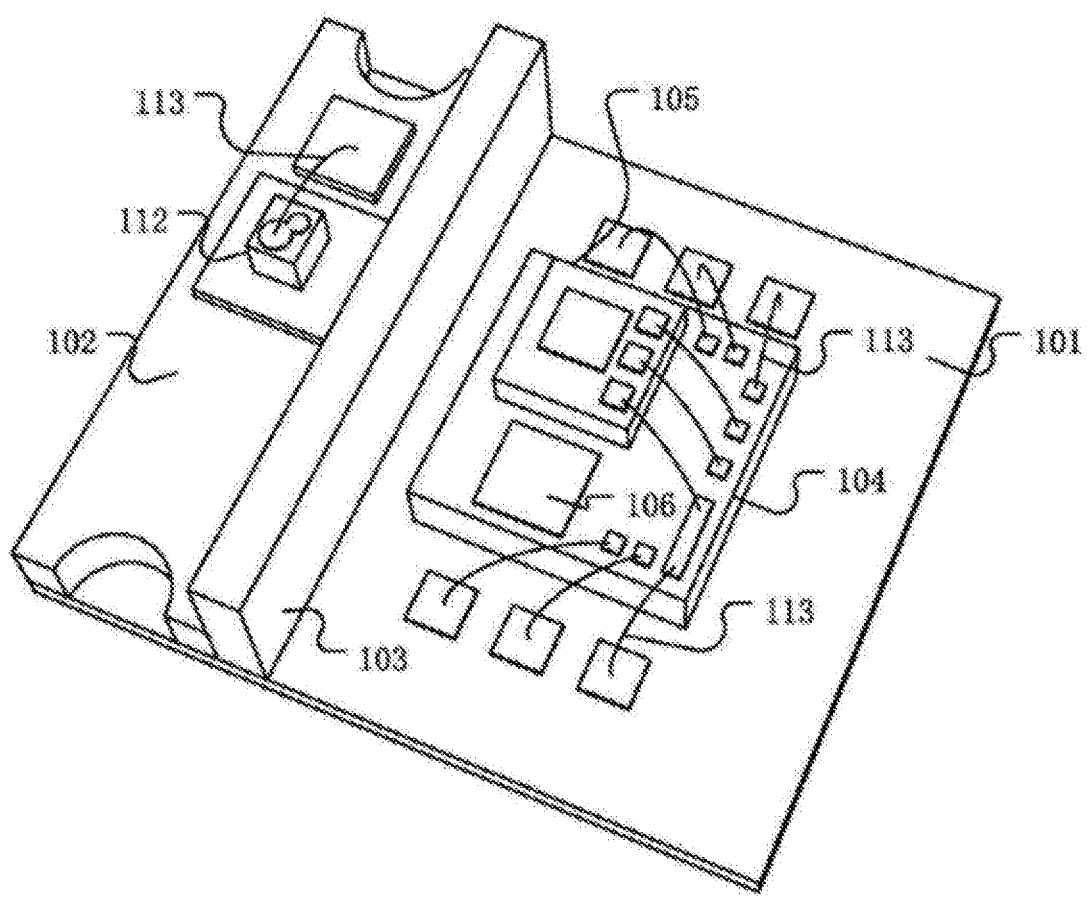
Figure 8G:
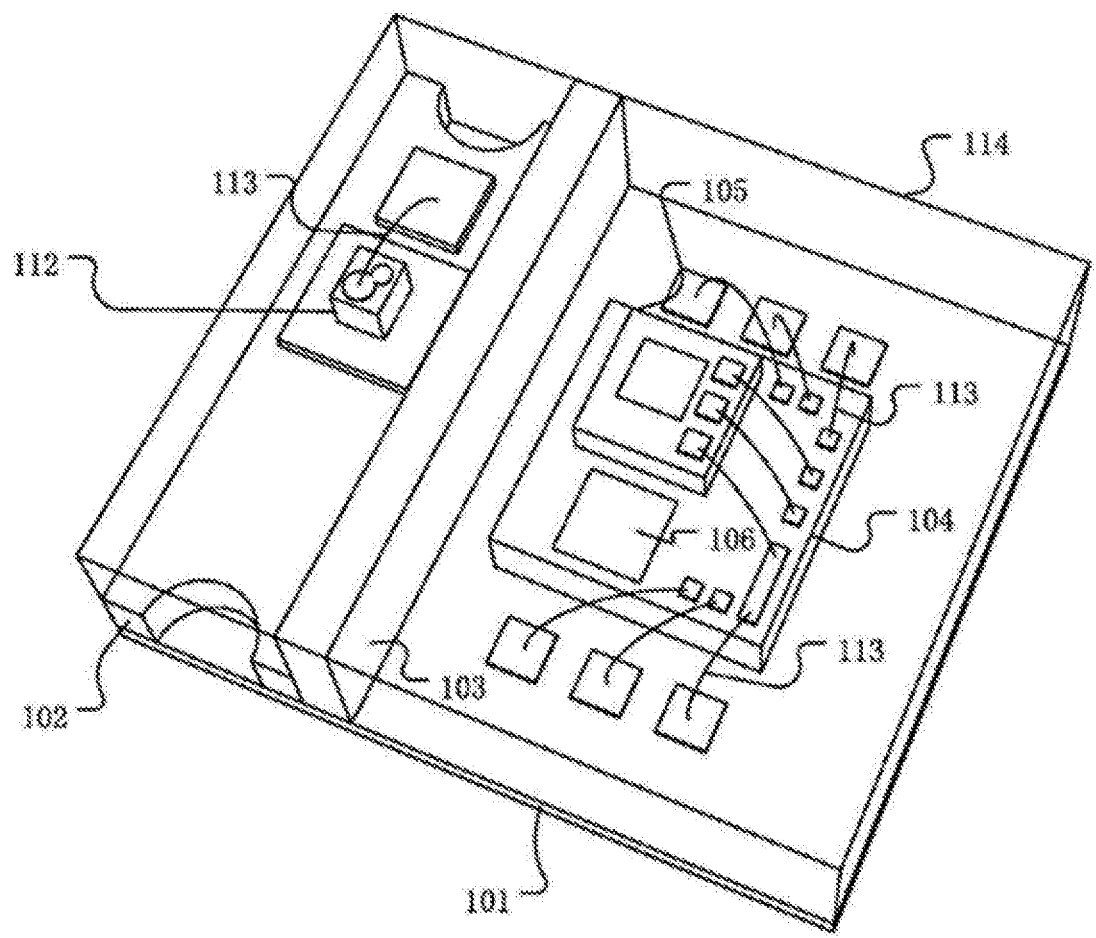

In FIG. 8D, ambient light sensor 105 can be installed on the upper surface of integrated circuit chip 104, and ambient light sensor 105 can effectively be bulged by a predetermined thickness relative to the upper surface of integrated circuit die 104. For example, ambient light sensor 105 may not shield proximity sensor 106. In FIG. 8E, light-emitting component 112 can be installed on the upper surface of pads 111 arranged on circuit board 102. In FIG. 8F, pads may be connected to corresponding pads, and corresponding components can be respectively connected through wires 113. In FIG. 8G, transparent encapsulant layer 114 can encapsulate light-emitting component 112, integrated circuit die 104, ambient light sensor 105, and baffle 103.

Figure 9A:
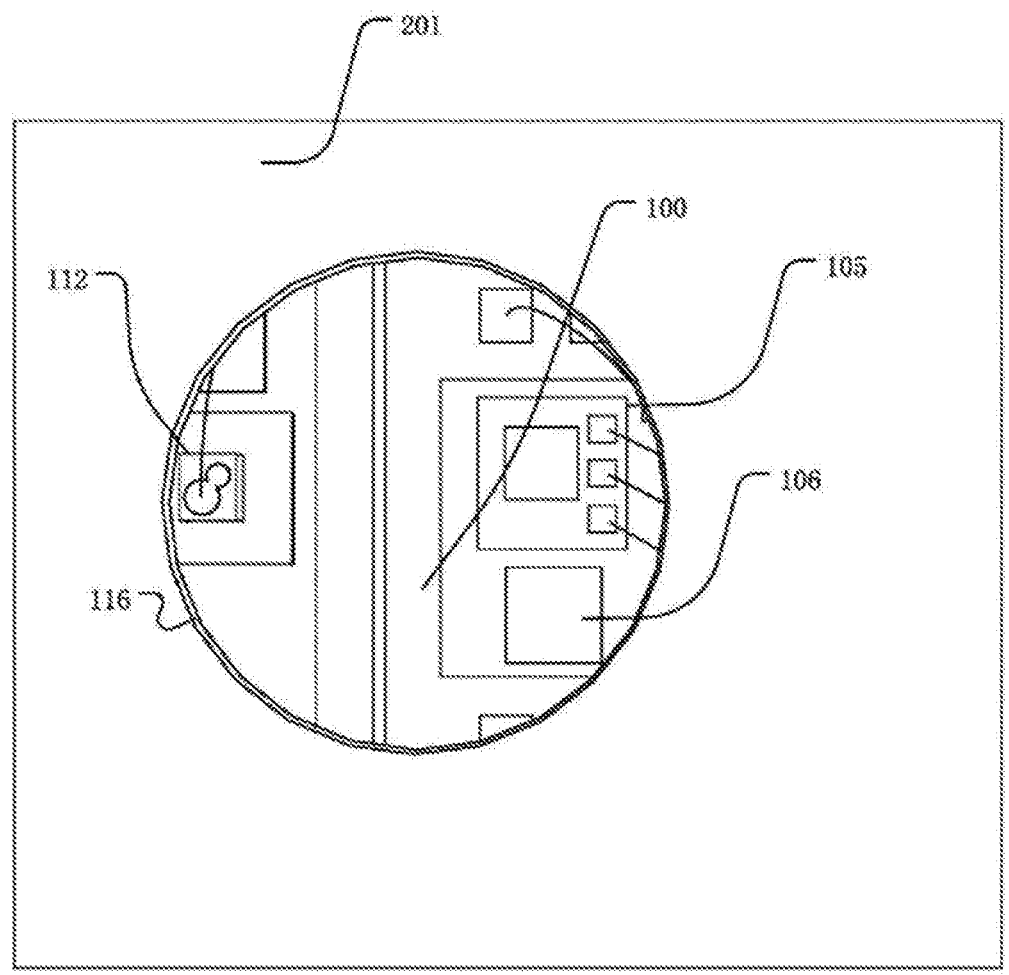
FIG. 9A is a perspective view of example electronic devices in use states, in accordance with embodiments of the present invention.
Figure 9B:
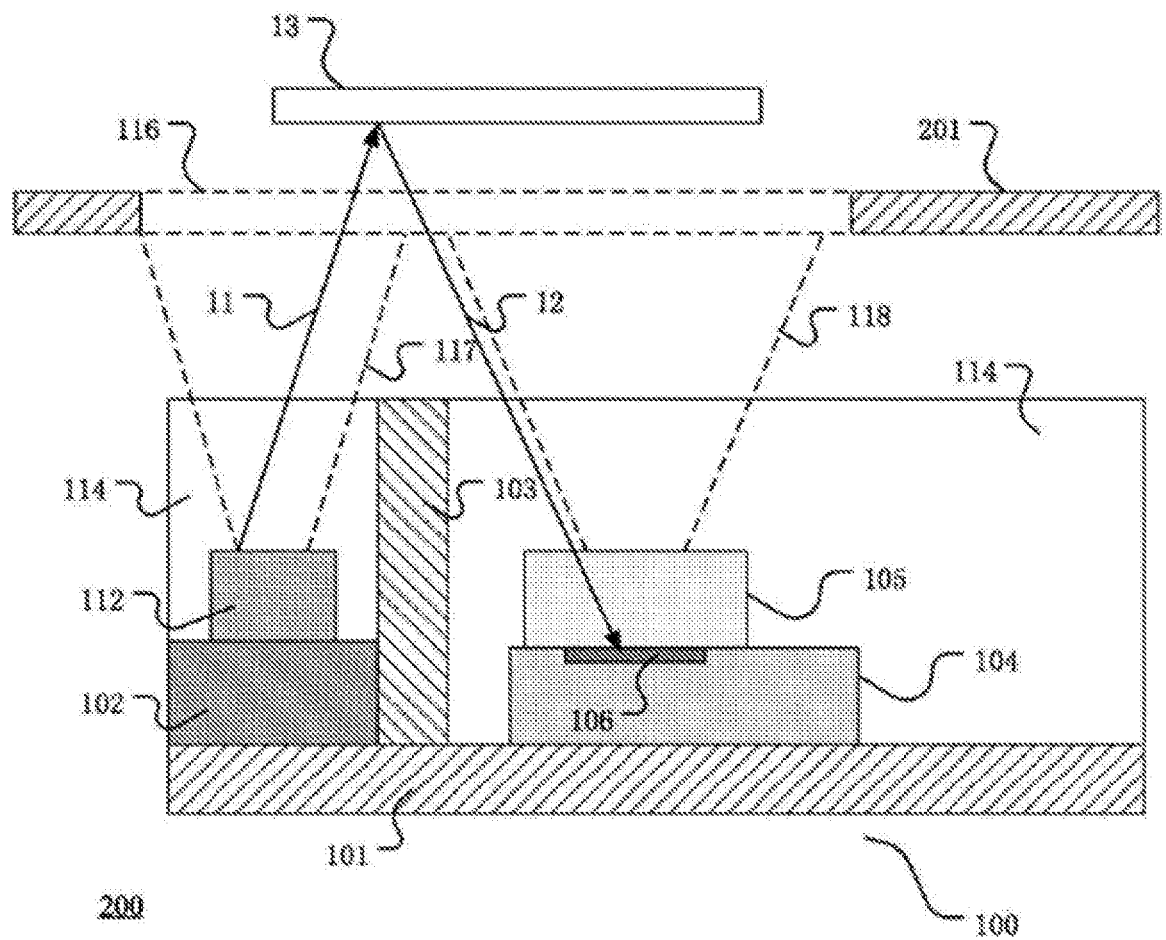
FIG. 9B is a cross-sectional view of example electronic devices in use states, in accordance with embodiments of the present invention.

Referring now to FIGS. 9A and 9B, shown are views of example electronic devices in use states, in accordance with embodiments of the present invention. In this particular example, the electronic devices can include shell 201 having opening 116. Optical sensor package assembly 100 can be located within shell 201, and irradiation light may be emitted. Also, light may be reflected by the irradiation light on the surface of the external object, and ambient light can be received through opening 116.

The surface of electronic device 200 (e.g., a smart phone) may have a relatively small aperture opening 116. Optical sensor package assembly 100 can perform ambient light sensing and distance detection through the small aperture opening 116 located above assembly 100. In order to realize the sensing of ambient light brightness and the proximity of the object, in optical sensor package assembly 100, emission path range 117 of light-emitting component 112, and ambient light sensing range 118 of ambient light sensor 105, can both be within the region limited by the relatively small aperture opening 116.

In one case, when object 13 approaches the small aperture opening 116 located on optical sensor package 100, light of the self-emitting source of light-emitting component 112 (e.g., self-emitting light 11) can be emitted to the surface of object 13 via the small aperture opening 116, and reflected light 12 can be reflected to proximity sensor 106 via the small aperture opening 116. For example, the angle between self-emitting light 11 and reflected light 12 can be the proximity sensing angle between light-emitting component 112 and proximity sensor 106.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. An optical sensor package assembly, comprising:
   a) a first circuit board;
   b) a second circuit board and a first structure that are both arranged on said first circuit board, wherein said second circuit board is adjacent to said first structure; and
   c) a second structure arranged on said second circuit board, wherein a thickness of said first structure is equal to a combined thickness of said second circuit board and said second structure.

2. The optical sensor package assembly of claim 1, wherein:
   a) said first structure comprises a proximity sensor;
   b) said second structure comprises a light-emitting component; and
   c) irradiation light emitted by said light-emitting component is reflected by an external object to reach said proximity sensor in order to detect the approach of said external object.

3. The optical sensor package assembly of claim 2, wherein said first structure comprises an ambient light sensor configured to detect the brightness of ambient light.

4. The optical sensor package assembly of claim 3, wherein:
   a) said proximity sensor is embedded in the surface of an integrated circuit die;
   b) said ambient light sensor is arranged on an area adjacent to said proximity sensor of said integrated circuit die; and
   c) the sum of the thickness of said ambient light sensor and said integrated circuit chip is equal to said first thickness.

5. The optical sensor package assembly of claim 4, wherein said ambient light sensor is electrically connected to said integrated circuit die.

6. The optical sensor package assembly of claim 1, further comprising a baffle arranged between said first structure and said second structure, and being configured to prevent light generated by said second structure from reaching said first structure.

7. The optical sensor package assembly of claim 6, wherein at least one side of said second circuit board comprises a groove.

8. The optical sensor package assembly of claim 7, wherein at least one side of said second circuit board is retracted by a predetermined distance relative to a corresponding side of said first circuit board.

9. The optical sensor package assembly of claim 8, wherein:
   a) said second circuit board has a first side and a second side opposite to each other; and
   b) said first side is adjacent to said baffle and said second side is retracted by said predetermined distance relative to a corresponding side of said first circuit board.

10. The optical sensor package assembly of claim 9, wherein said second circuit board comprises a third side and a fourth side opposite to each other, wherein each of said third and fourth sides comprises a groove.

11. The optical sensor package assembly of claim 10, wherein said groove is a U-shaped groove.

12. The optical sensor package assembly of claim 1, further comprising a transparent encapsulant layer configured to encapsulate said first structure, said second structure, and said second circuit board.

13. The optical sensor package assembly of claim 1, wherein:
   a) said second circuit board comprises a first group of pads and a second group of pads positioned on a first surface and a second surface of said second circuit board opposite to each other, wherein the first and second groups of pads are connected to each other; and
   b) said second structure is located on said first surface of said second circuit board and is electrically connected to said first group of pads through bonding wires.

14. The optical sensor package assembly of claim 13, wherein:
   a) said first circuit board comprises a third group of pads and a fourth group of pads positioned on a first surface and a second surface of said first circuit board opposite to each other, wherein the third and fourth groups of pads are connected to each other;
   b) said first structure is located on said first surface of said first circuit board and is electrically connected to said third group of pads through bonding wires; and
   c) said second group of pads and said third group of pads are connected to each other, and said fourth group of pads are electrically connected to external circuits.

15. An electronic device, comprising the optical sensor package assembly of claim 1, and further comprising:
   a) a shell having an opening, wherein said optical sensor package assembly is located within said shell; and
   b) wherein irradiation light is emitted through said opening, and light reflected by surface of said external object and ambient light are received through said opening.

16. A method of manufacturing an optical sensor package assembly, the method comprising:
   a) arranging both a second circuit board and a first structure on a first circuit board, wherein said second circuit board is adjacent to said first structure; and
   b) arranging a second structure on said second circuit board, wherein a thickness of said first structure is equal to a combined thickness of said second circuit board and said second structure.

17. The method of claim 16, wherein:
   a) said first structure comprises a proximity sensor, and said second structure comprises a light-emitting component; and
   b) irradiation light emitted by said light-emitting component is reflected to reach said proximity sensor to detect the approach of an external object.

18. The method according to claim 17, wherein said first structure comprises an ambient light sensor for detecting the brightness of ambient light.

19. The method of claim 18, wherein:
   a) said proximity sensor is embedded in the surface of an integrated circuit die;
   b) said ambient light sensor is arranged on an area adjacent to said proximity sensor of said integrated circuit die; and
   c) the sum of the thickness of said ambient light sensor and said integrated circuit chip is equal to said first thickness.

20. The method of claim 16, wherein at least one side of said second circuit board is retracted by a predetermined distance relative to a corresponding side of said first circuit board.

* * * * *